(12) United States Patent
Schneider et al.

(10) Patent No.: US 12,313,712 B2
(45) Date of Patent: May 27, 2025

(54) SENSOR FOR DETECTING GRADIENT-BOUNDED INTERFERENCE TO A MAGNETIC RESONANCE TOMOGRAPHY SYSTEM AND METHOD FOR OPERATION

(71) Applicant: Siemens Healthineers AG, Forchheim (DE)

(72) Inventors: Rainer Schneider, Höchstadt (DE); Jürgen Nistler, Erlangen (DE); Razvan Lazar, Erlangen (DE); Stephan Biber, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 196 days.

(21) Appl. No.: 18/110,506

(22) Filed: Feb. 16, 2023

(65) Prior Publication Data

US 2023/0280425 A1 Sep. 7, 2023

(30) Foreign Application Priority Data

Mar. 1, 2022 (DE) .................... 10 2022 202 078.2

(51) Int. Cl.
*G01R 33/385* (2006.01)
*G01R 33/36* (2006.01)
*G01R 33/565* (2006.01)

(52) U.S. Cl.
CPC ..... *G01R 33/3852* (2013.01); *G01R 33/3621* (2013.01); *G01R 33/56518* (2013.01)

(58) Field of Classification Search
CPC ............ G01R 33/3621; G01R 33/3852; G01R 33/56518
See application file for complete search history.

(56) References Cited

U.S. PATENT DOCUMENTS

| 6,469,515 B2 * | 10/2002 | Borsi ................... G01R 33/385 324/536 |
| 7,583,083 B2 | 9/2009 | Biber et al. |
| 10,088,534 B2 * | 10/2018 | Saint-Jalmes .... G01R 33/56572 |
| 2008/0315879 A1 | 12/2008 | Saha |

(Continued)

FOREIGN PATENT DOCUMENTS

| DE | 102018212858 A1 | 2/2020 |
| EP | 3537169 A1 | 9/2019 |
| WO | 2019068687 A3 | 5/2019 |

OTHER PUBLICATIONS

Schneider, "Apparatus and Method for Overcoming Artifacts and Finding the Origin of Gradient Spikes", Siemens AG, DE-Erlangen, May 19, 2021. pp. 1-3.

*Primary Examiner* — Gregory H Curran
(74) *Attorney, Agent, or Firm* — Lempia Summerfield Katz LLC

(57) ABSTRACT

A magnetic resonance tomography system with a sensor for detecting spikes and with a gradient coil. Nuclear spins of an object under observation are excited by a magnetic alternating field of the magnetic resonance tomography system. A gradient field is generated by the magnetic resonance tomography system using the gradient coil. A magnetic resonance signal is acquired using a receiving antenna of the magnetic resonance tomography system and an interference signal using the sensor. From the magnetic resonance signal an image is reconstructed as a function of the acquired interference signal of the sensor.

15 Claims, 5 Drawing Sheets

(56) References Cited

U.S. PATENT DOCUMENTS

| | | |
|---|---|---|
| 2017/0108569 A1* | 4/2017 | Harvey .................. G01R 33/36 |
| 2019/0277933 A1 | 9/2019 | Nistler |
| 2020/0041589 A1 | 2/2020 | Dietz et al. |
| 2020/0249292 A1 | 8/2020 | Biber |

* cited by examiner

SENSOR FOR DETECTING GRADIENT-BOUNDED INTERFERENCE TO A MAGNETIC RESONANCE TOMOGRAPHY SYSTEM AND METHOD FOR OPERATION

CROSS REFERENCE TO RELATED APPLICATIONS

This application claims the benefit of DE 102022202078.2 filed on Mar. 1, 2022, which is hereby incorporated by reference in its entirety.

FIELD

Embodiments relates to a magnetic resonance tomography system with a sensor for detecting spikes and with a gradient coil where the sensor is arranged in the immediate vicinity of the gradient coil.

BACKGROUND

Magnetic resonance tomography systems are imaging devices that in order to map an object under examination align nuclear spins of the object under examination with a strong external magnetic field and use a magnetic alternating field to excite them for precession about this alignment. The precession or return of the spins from this excited state to a state with less energy in turn in response generates a magnetic alternating field, that is received via antennas.

With the help of magnetic gradient fields, a position encoding is imposed on the signals, that then provides the received signal to be assigned to a volume element. The received signal is then evaluated and a three-dimensional imaging representation of the object under examination is provided. To receive the signal use is made of local receiving antennas, known as local coils, that to achieve a better signal-to-noise ratio may be arranged directly on the object under examination.

The high voltages, currents, changes in the fields and the high mechanical stresses on the gradient coils result in static charges and in electromagnetic interference when they are discharged. This electromagnetic interference may result in artifacts in the magnetic resonance images captured.

Known from EP 3537169 A1 is a method for detecting spikes by the body coil.

BRIEF SUMMARY AND DESCRIPTION

The scope of the present disclosure is defined solely by the appended claims and is not affected to any degree by the statements within this summary. The present embodiments may obviate one or more of the drawbacks or limitations in the related art.

Embodiments provide a method and a device that provide an improved image.

The magnetic resonance tomography system includes a sensor for detecting spikes. Spike here means short-term electromagnetic interference, as caused for example by static discharges. The spikes normally have a wide frequency spectrum.

The magnetic resonance tomography system further includes a gradient coil that generates magnetic gradient fields for image capture and is the source of the spikes. The sensor may be arranged in the immediate vicinity of the gradient coil.

Immediate vicinity refers to an arrangement of the sensor inside the patient tunnel or on a surface of the gradient coil.

The sensor is configured to detect at least some of the energy of the electrical and/or magnetic alternating fields of the spike and to emit it as an interference signal at a signal output. A level of the spike in the interference signal may be significantly above a level of other signals such as, for example, of the magnetic resonance signal, for example by 6 dB, 12 dB, 18 dB or more. This may be achieved for example as explained below by an arrangement in the vicinity of the gradient coil, a sensitivity to the generated fields or a suitable spectral sensitivity.

The sensor may also be a local coil of the magnetic resonance tomography system that is configured to detect electromagnetic alternating fields of the spike at least in one frequency range of the magnetic resonance signal or an adjacent frequency range.

The increased sensitivity of the sensor to interference signals generated by spikes in the gradient coil advantageously provides the sensors to be differentiated and/or isolated from the magnetic resonance signals.

In one step of the method a gradient field is generated by a gradient amplifier for the generation of a current and by the gradient coil, that is fed with the current. The gradient field is for example used for position encoding.

In a further step an interference signal is acquired via the sensor. The acquisition of the interference signal may be performed using a receiver of the magnetic resonance signal.

Spikes may in this case generate very high amplitudes that exceed the dynamic of the receiver for the interference signals. The receive path for the interference signal may include a facility to change the amplification of the receive path, for example an adjustable attenuator or an adjustable amplifier, so that the interference signal may be detected without overmodulation. Thus, following an adjustment of the amplification, the next spike may be detected with all possible information and for example the localization may be performed more accurately.

The sensors in the method provide a particularly sensitive and secure detection of the spikes generated by the gradient coils.

In an embodiment, the method further includes the step of exciting nuclear spins in a static magnetic field B0 of an object under examination by a magnetic alternating field B1 to form a precession. The magnetic alternating field is normally generated by an oscillator, amplified by a radio-frequency end stage, and emitted into the object under examination via a body coil or local transmit antenna.

In a further step a magnetic resonance signal of the excited nuclear spins is acquired with a receiving antenna of the magnetic resonance tomography system.

The acquisition of the magnetic resonance signal and of the interference signal may be performed simultaneously with the generation of the gradient field. However, the magnetic resonance signal may be acquired at a later point in time.

In a further step of the method an image of the object under examination is reconstructed from the magnetic resonance signal as a function of, or with consideration of, the acquired interference signal of the sensor.

For example, the magnetic resonance signal for the period of a spike identified by the interference signal may be corrected or reconstructed and an image may be reconstructed from said magnetic resonance signal modified as a function of the interference signal. In the event of a spike being detected in the interference signal the detection of the magnetic resonance signal may be repeated at least in part and the image is reconstructed on the basis of the magnetic resonance signal that is free from interference.

The method advantageously provides the image to be reconstructed free from interference thanks to the reliable identification of the spikes.

In an embodiment, in the step of the acquisition of an interference signal the interference signal is acquired using a plurality of interference sensors distributed over the extent of the gradient coil. The sensors, as corner points of a polyhedron, for example span a two-dimensional or better a three-dimensional space. The plurality of sensors may be densely distributed over the gradient coil, so that no point of the gradient coil is further away from a sensor than a predetermined maximum distance. In this case the maximum distance may be less than a half, a quarter, or a tenth of the largest dimension of the gradient coil.

In a further step, the magnetic resonance tomography system determines a place of origin of the interference signal as a function of the position of the sensors and the plurality of acquired interference signals. A place of origin may be determined via the differences in travel time of the spike signal to the various sensors. Also possible is an evaluation of the amplitudes. In the simplest case the place of origin of the spike may for example be restricted to an area surrounding a sensor with the strongest signal. The surrounding area may be restricted to a radius less than half the distance to the sensor with the next-weakest signal around the sensor with the strongest signal. However, it is also conceivable for this or other different methods to be combined with one another. An optimization method is conceivable in this case in which an error in position determination is minimized by the various methods.

Locating the place of origin of the spike advantageously provides the cause to be eliminated and therefore artifacts in the image capture to be reduced.

In an embodiment, the sensor is configured to acquire an interference signal with a frequency not equal to a Lamor frequency of the magnetic resonance tomography system. This is understood to mean that a sensitivity of the sensor to an interference signal with a frequency not equal to a Lamor frequency of the magnetic resonance tomography system is equal to or 6 dB, 12 dB or higher compared to a magnetic resonance signal with a Lamor frequency. To evaluate a sensitivity, consideration is in particular given to a level at a signal output of the sensor.

The resonance frequencies of nuclear spins to be detected in the static magnetic field B0 of the magnetic resonance tomography system are regarded as Lamor frequencies of the magnetic resonance tomography system. This relates in particular to the resonance frequency of a proton, but also of other elements to be detected, that may also be referred to as X-cores. The sensor also detects interference signals with a frequency greater than the highest Lamor frequencies to be detected with the magnetic resonance tomography system.

Detecting the spikes with the sensor at a frequency not equal to the Lamor frequency of the magnetic resonance tomography system advantageously provides them to be reliably differentiated from a magnetic resonance signal.

In an embodiment of the magnetic resonance tomography system, the sensor is arranged on the gradient coil or a side of a body coil facing the gradient coil. The sensor may be mechanically connected to the gradient coil or the body coil, so that the sensor remains at a predetermined relative position close thereto. In contrast, electrically an ohmic insulation may be present. It is also regarded in this case as arranged on the gradient coil or the body coil if the sensor is mechanically connected to a support structure or shielding of the body coil. The shielding is not arranged between the sensor and the gradient coil.

An arrangement directly on the gradient coil or the outer side facing the gradient coil or the shielding thereof advantageously provides a space-saving positioning close to the gradient coil and thus to the source of the interference.

In an embodiment of the magnetic resonance tomography system, the sensor is embedded in a support material of the gradient coil. The support material may be insulating, for example made from a plastic material or synthetic resin, into which the gradient coil is embedded. At least the part of the sensor that acquires the electromagnetic alternating fields of a spike may be embedded into the support material, for example a conductor surface or conductor loop. Elements for further signal processing, for example active elements such as a preamplifier, may also be arranged outside or on the surface of the support material, so that for example the active elements may be replaced in the event of a fault. A plurality of sensors may be embedded in the support material over the extent of the gradient coil.

Thanks to the arrangement in the support material the sensor is or the sensors are advantageously in the immediate vicinity of the source of the spikes, so that the spikes may be detected with maximum sensitivity.

In an embodiment, the sensor is arranged on an insulating layer. This insulating layer may simultaneously produce the mechanical connection to the gradient coil or the body coil or the shielding thereof. The insulating layer may be a plastic, for example a foamed material or else a material with a low dielectric constant such as Teflon. The sensor as a conductor loop or conductor surface may be attached to this insulating layer as a support material.

Arranging the sensor on an insulating layer provides the sensor to be produced and mounted in a particularly simple manner.

In an embodiment of the magnetic resonance tomography system the sensor includes a conductor surface for detecting a spike. Detecting a spike is here understood to mean that the conductor surface is the part of the sensor that generates a signal, for example an alternating voltage or an alternating current, for further processing from the electrical and/or magnetic alternating field of the spike. For example, the conductor surface is not a ground plane. Examples of conductor surfaces for capacitive or inductive antennas are specified in greater detail in the subclaims below and in the description of the figures.

In an embodiment, the conductor surface is part of a radio-frequency shield of the gradient coil. A radio-frequency shield may be arranged between body coil and gradient coil. The purpose of the radio-frequency shield is to prevent energy from being removed from the radio-frequency electrical and/or magnetic alternating field, that irradiates the body coil for excitation of the nuclear spins, through the gradient coil, and/or the superconducting magnet from heating up as a result.

Configuring the sensor as part of the radio-frequency shield provides a space-saving construction that extends over significant parts of the extension of the gradient coil.

In an embodiment of the magnetic resonance tomography system the sensor includes a frequency-selective preamplifier. Frequency-selective is to be understood as meaning that the amplification for signals with different frequencies is different, for example by 6 dB, 12 dB, 18 dB or more for preferred frequencies compared to undesired frequencies. Undesired frequencies for the sensor are frequencies that contain the magnetic resonance signal. The preamplifier may in this case also include other elements, for example matching elements such as a balancing unit or impedance transformer.

A frequency-selective preamplifier advantageously provides a better differentiation between spike and magnetic resonance signal.

In an embodiment, the sensor is in signal connection with a receiver of the magnetic resonance tomography system. A receiver that may also be used for the acquisition of a magnetic resonance signal for imaging is regarded as a receiver of the magnetic resonance tomography system.

The use of a receiver for magnetic resonance signals provides flexible use and simple retrofitting of interference suppression in an existing magnetic resonance tomography system.

In an embodiment of the magnetic resonance tomography system the sensor includes an electrical field antenna or a capacitive antenna. An electrical field antenna is understood to mean an antenna that may be sensitive to an electrical field component of a spike, in other words delivers a signal even without a B-field or shielding thereof. An electrical field antenna may for example be a monopole or dipole. Embodiments may include a conductive surface, for example on the insulating layer, so that the sensor forms a capacitor vis-à-vis the gradient coil.

An electrical field antenna is less sensitive to the magnetic resonance signals and the preferred magnetic field component thereof.

In an embodiment of the magnetic resonance tomography system the sensor includes a B-field antenna or inductive antenna. B-field antenna is understood to mean an antenna that essentially detects a magnetic alternating field component. A B-field antenna may be configured as a conductor loop or coil with multiple windings.

A conductor loop, because of the lower capacitance, advantageously includes fewer interactions with the antennas for the magnetic resonance detection, for example if the B-field antenna is tuned to a frequency not equal to the Lamor frequency.

In an embodiment, the antenna of the sensor is resonant. In this case the antenna is may be resonant at a frequency not equal to the Lamor frequency. This may be achieved for example by suitable dimensioning of the antenna, so that the self-capacitance and inductance of the antenna itself or in connection with additional capacitances and/or inductances form a resonant oscillating circuit.

In the case of a resonant antenna, thanks to the antenna a signal of a spike may advantageously already be preferred over a magnetic resonance signal.

In an embodiment of the magnetic resonance tomography system the antenna of the sensor includes a detuning device. The detuning device may be realized for example by PIN diodes or switches that change the complex resistance of the antenna.

The detuning device provides the sensor to be protected against damage by the excitation pulse of the magnetic resonance tomography system.

In an embodiment, the magnetic resonance tomography system includes a plurality of sensors that are distributed over an extension of the gradient coil. The sensors may be distributed equally, so that a spike with a predetermined maximum field strength gives rise in at least one sensor to a signal greater than a predetermined threshold value from any location on or in the gradient coil. This may be achieved in that, from any location on the gradient coil, a sensor is arranged at a distance less than a maximum distance, for example by distributing the sensors in a square-shaped or hexagonal grid over the surface of the gradient coil.

The plurality of distributed sensors permits the reliable detection of all spikes of a gradient coil, regardless of the place of origin.

In an embodiment of the method a portion of the interference signal in the acquired magnetic resonance signal is reduced. This may be achieved for example, by, already at the time the magnetic resonance signal and the interference signal are acquired, adding the interference signal with a suitable attenuation/amplification and phase displacement to the magnetic resonance signal, so that the portion of interference signal in the magnetic resonance signal is reduced by destructive interference. This may be done as part of the signal processing in the receivers. The parameters such as attenuation and phase displacement may in this case be adjusted using an optimization method, for example by minimizing the energy of the sum signal. A preceding calibration of the parameters by spike signals without magnetic resonance signals of a sample may be used. The method may also be performed multidimensionally for a plurality of parameters of a plurality of sensors. However, the reduction in the portion of the interference signal may also be applied subsequently to the acquired and stored magnetic resonance signals and interference signals, for example as part the reconstruction.

In this way it is advantageously possible to prevent the signals being detected repeatedly.

In an embodiment of the method the interference signal of the sensor is detected by a receiver of the magnetic resonance tomography system for magnetic resonance signals.

In this way the hardware of the magnetic resonance tomography system may advantageously be used flexibly for various purposes and a separate receiver for the sensor is not required.

In an embodiment of the method the receiver performs a spectral weighting of the interference signal. The receiver may include, in software or hardware, a filter function that prefers a frequency of a signal over an undesired frequency and delivers a higher level, for example by 6 dB, 12 dB, 18 dB or more. On receipt of the sensor the undesired frequencies may be the frequencies of the magnetic resonance signal around the Lamor frequency. In interaction with a resonant antenna of the sensor an overmodulation of the receiver for the sensor signal may be prevented by filtering in the antenna itself.

The spectral weighting advantageously facilitates the identification of the spike compared to magnetic resonance signals. Realization as a software filter provides additional flexibility here, for example with different Lamor frequencies in the case of a magnetic resonance tomography system for different cores, known as X-core applications.

BRIEF DESCRIPTION OF THE FIGURES

The above-described properties, features and advantages and the manner in which they are achieved will become clearer and more readily understandable in connection with the following description of certain embodiments, that are explained in greater detail in connection with the drawings.

DETAILED DESCRIPTION

Figure 1:
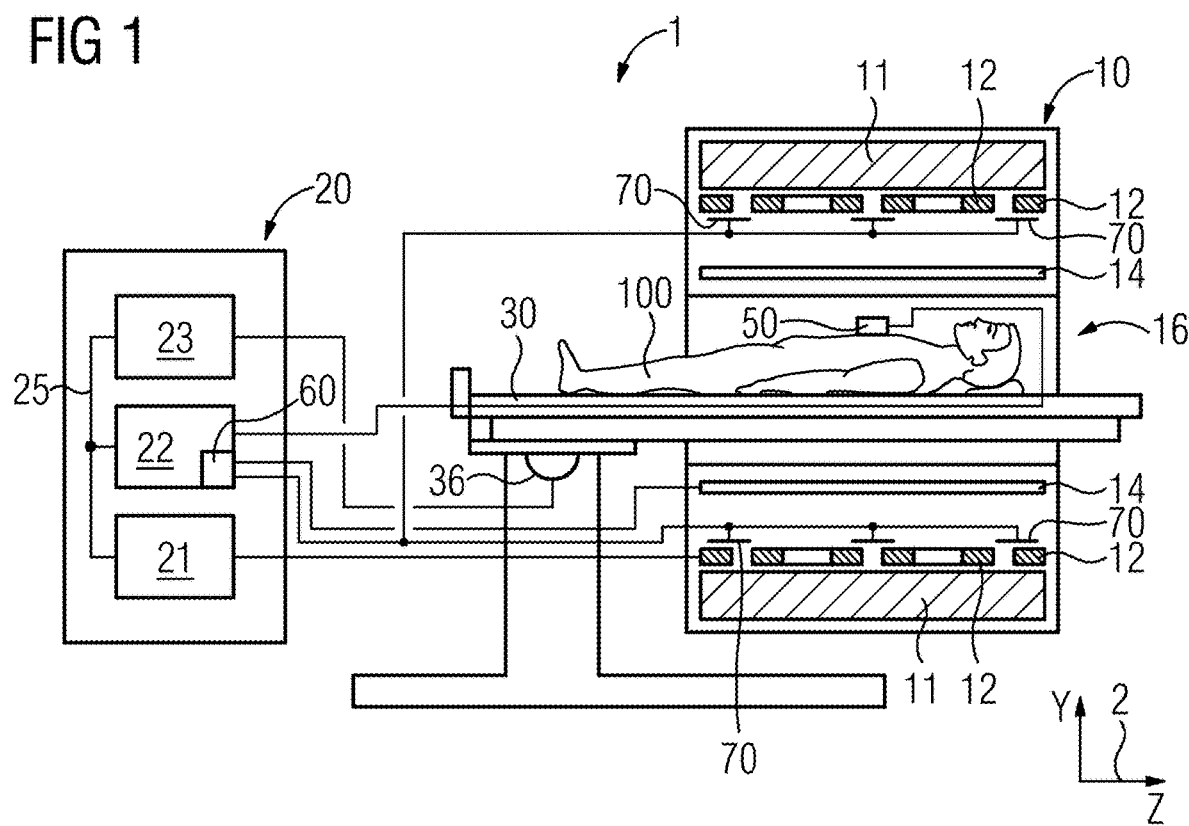
FIG. 1 depicts a schematic representation of a magnetic resonance tomography system according to an embodiment.

FIG. 1 depicts a schematic representation of a magnetic resonance tomography system 1 with a plurality of sensors 60 for detecting spikes.

The magnet unit 10 includes a field magnet 11 that generates a static magnetic field B0 for the alignment of nuclear spins of samples or patients 100 in an acquisition area. The acquisition area is arranged in a patient tunnel 16 that extends in a longitudinal direction 2 through the magnet unit 10. A patient 100 may be moved into the acquisition area by the patient couch 30 and the travel unit 36 of the patient couch 30. Normally the field magnet 11 is a superconducting magnet that may provide magnetic fields with a magnetic flux density of up to 3 T, and in the latest devices even more than this. For lower field strengths however, use may also be made of permanent magnets or electromagnets with normally conducting coils.

The magnet unit 10 furthermore includes gradient coils 12 that are configured, for the spatial differentiation of the captured mapping regions in the examination volume, to overlay the magnetic field B0 with variable magnetic fields in three spatial directions. The gradient coils 12 are usually coils made of normally conducting wires that may generate fields orthogonal to one another in the examination volume.

The magnet unit 10 likewise includes a body coil 14 that is configured to irradiate a radio-frequency signal, supplied via a signal line 33, into the examination volume and to receive resonance signals emitted by the patient 100 and to deliver them via a signal line. However, for the transmission of the radio-frequency signal and/or the receipt the body coil 14 may be replaced by local coils 50 that are arranged in the patient tunnel 16 close to the patient 100. However, the local coil 50 may be configured to send and receive and therefore a body coil 14 may be dispensed with.

A control unit 20 supplies the magnet unit 10 with the various signals for the gradient coils 12 and the body coil 14 and evaluates the received signals. A magnetic resonance tomography system controller 23 in this case coordinates the sub-units.

The control unit 20 includes a gradient controller 21 that is configured to supply the gradient coils 12 via feed lines with variable currents that provide the desired gradient fields in the examination volume in a time-coordinated manner.

The control unit 20 further includes a radio-frequency unit 22 that is configured to generate a radio-frequency pulse with a predefined temporal curve, amplitude, and spectral power distribution for the excitation of a magnetic resonance of the nuclear spins in the patient 100. In this case pulse powers in the kilowatt range may be achieved. The individual units are connected to one another via a signal bus 25.

The radio-frequency signal generated by the radio-frequency unit 22 is fed via a signal connection of the body coil 14 and is transmitted into the body of the patient 100, in order there to excite the nuclear spins. However, the radio-frequency signal may be transmitted via one or more local coils 50.

The local coil 50 then receives a magnetic resonance signal from the body of the patient 100, since because of the small distance the signal-to-noise ratio (SNR) of the local coil 50 is better than during receipt by the body coil 14. The MR signal received by the local coil 50 is processed in the local coil 50 and forwarded to the radio-frequency unit 22 of the magnetic resonance tomography system 1 for evaluation and image capture. To this end use is made of the signal connection 33, but a wireless transmission may be used.

A plurality of sensors 70 are distributed in the vicinity of the gradient coil 12 over the extent thereof along the patient tunnel 14. In this way the sensors 70 may detect electrical and/or magnetic alternating fields that are caused by spikes in or on the gradient coil 12 due to mechanical stresses or electrical fields during gradient generation, even if the mechanical stresses or electrical fields arise at different locations in the gradient coil. Details of the design of the sensors 70 and the arrangement thereof are explained in greater detail for the following figures.

The sensors 70 are in signal connection with receivers 60, so that spikes detected by the sensors may be evaluated by the receiver or receivers 60. The signal connection may analogously transmit the detected spikes as electrical signals. It is also conceivable for processing or digitalization already to take place in the sensor and for the resulting signals to be transmitted electrically, optically or wirelessly to the receiver or receivers 60.

Figure 2:
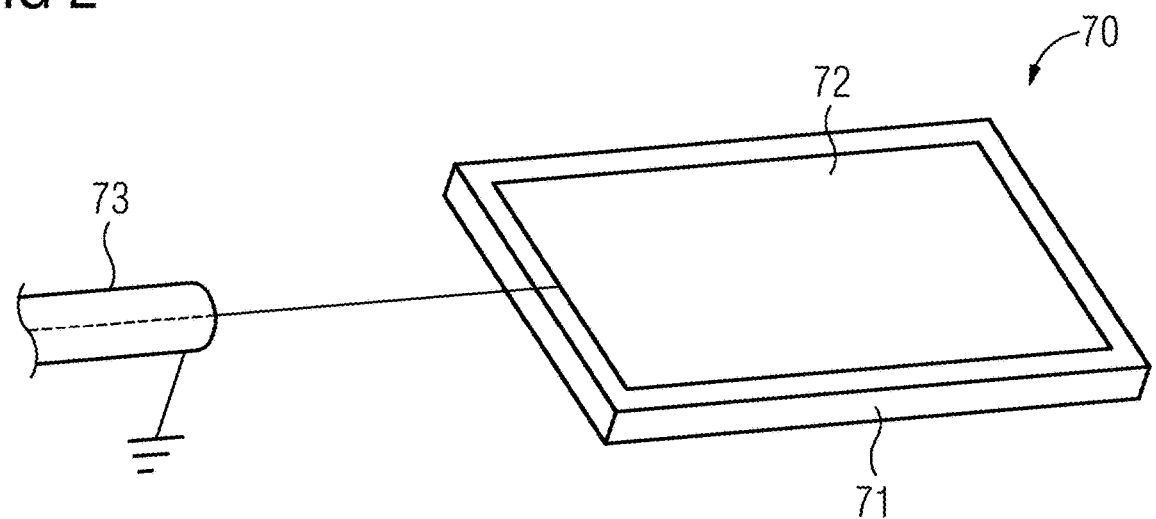
FIG. 2 depicts a schematic representation of the sensor according to an embodiment.

FIG. 2 depicts an embodiment of a sensor. The sensor is configured as an electrical-field antenna. A conductor surface 72 is arranged on an insulating layer 71. The insulating layer 71 may in this case for example be arranged on an inner side, facing the patient 100, of the gradient coil 12, for example glued to the inner surface. It is also conceivable for it to be attached to an outer side, facing the gradient coil 12, of the body coil 14 or an outer shielding between body coil 14 and gradient coil 12. Also possible is a separate support arranged between body coil 14 and gradient coil 12, on which the sensor 70 or the sensors 70 are arranged. A coaxial cable 73 is represented as a signal connection. However, also conceivable are symmetrical signal connections, for example in connection with an upstream balancing unit.

Foamed materials in the form of a thin plate or layer may be used as an insulating layer 71, which on attachment to the substrate may be performed and may also even out small irregularities. The material of the insulating layer 71 may include small dielectric losses. Foils or plates made of Teflon may be used for example.

The conductor surface 72 may for example be worked from a copper foil or another metal. It is also conceivable for the sensor 70 to be configured as a flexible conducting path on a suitable support material.

A conductor surface 72 that is only connected to a first pole of the signal connection acts as a monopole or capacitor, depending on the ratio of the wavelength of an electromagnetic wave of the frequency to be detected to the dimension of the conductor surface 72. The monopole is in particular sensitive to the electrical field component, especially to spikes that arise between the conductor surface 72 and the gradient coil 12. In this case a second pole of the signal connection may be connected to a ground of the gradient coil 12.

Figure 3:
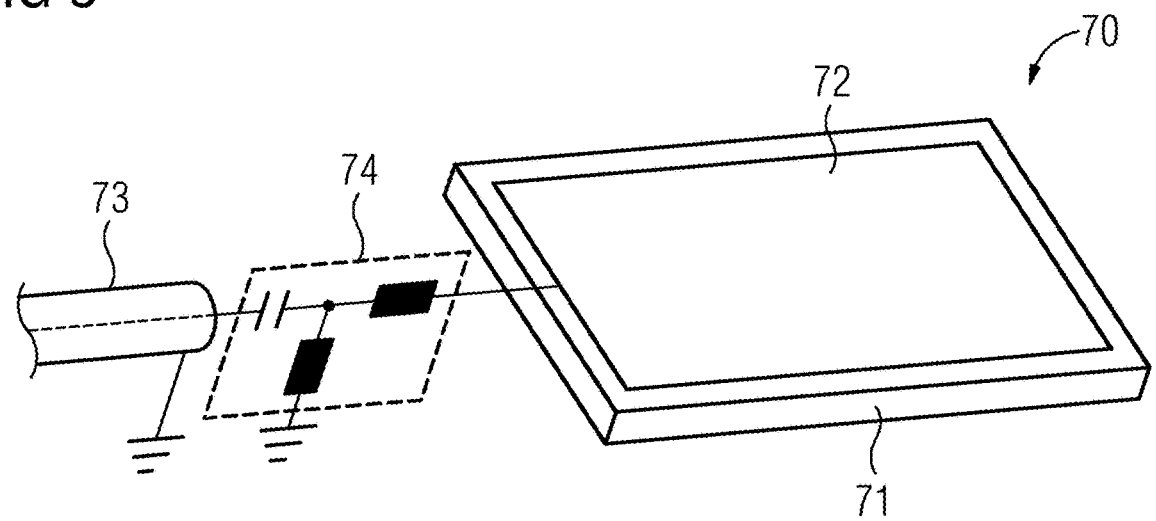
FIG. 3 depicts a schematic representation of the sensor according to an embodiment.

FIG. 3 depicts an embodiment of the sensor. The embodiment in FIG. 3 is distinguished by the electronic circuit 74 that is arranged between the sensor 70 and the signal connection. The electronic circuit 74 may be configured to set a predetermined frequency-dependent sensitivity of the sensor 70. To differentiate a spike from a magnetic resonance signal, use may be made of the property that as a short discharge the spike includes a very wide spectrum. A spike may consequently be identified in that it also has considerable frequency components beyond the Lamor frequency of the magnetic resonance tomography system 1 for the cores to be detected thereby. The electronic circuit 74 may include an absorption circuit that discharges a frequency component at the Lamor frequency to ground, or a parallel circuit made of a capacitor and inductor between sensor and signal connection, that blocks these frequencies. Also possible would be a high-pass circuit, that forwards frequencies above the Lamor frequency or the highest Lamor frequency of the magnetic resonance tomography system 1 from the sensor 70 to the receiver 60 via the signal connection. Sensors 70 with a preferred frequency range are also referred to below as resonant sensors 70.

The electronic circuit 74 may also assume the function of impedance matching from sensor 70 to the signal connection, e.g., the coaxial cable 74. The sensor 70 itself with its electrical properties such as capacitance and/or inductance may be part of the electronic circuit 74 or to influence the dimensioning thereof.

Not least, the electronic circuit 74 may include elements for the protection of the sensor 70 against overload by the excitation pulses, for example protective diodes or detuning elements, in order to limit or reduce an amplitude on the Lamor frequency.

Figure 4:
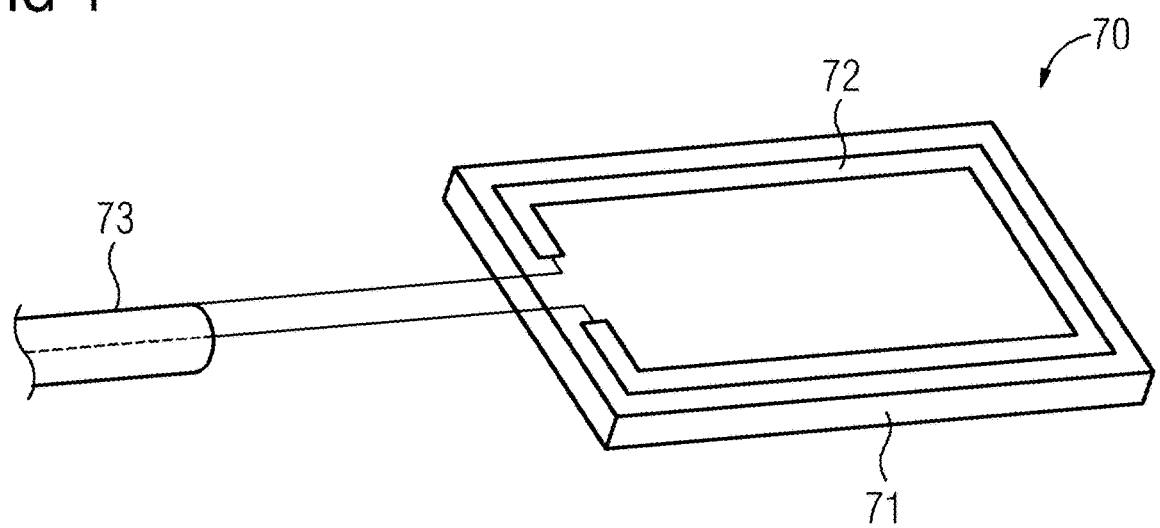
FIG. 4 depicts a schematic representation of the sensor according to an embodiment.

FIG. 4 depicts an embodiment of the sensor 74, in which the conductor surface 72 is configured as a conductor loop that electrically connects the first pole and the second pole of the signal connection to one another. Because of the enclosed surface, the sensor 70 may thus by induction detect transient magnetic fields, as are caused by the current of a spike discharge. In this way the sensor 72 is sensitive to the detection of magnetic alternating field components. In the case of the conductor loop the conductor surface 72 may also be reduced to the width of a conductor path or a wire.

Figure 5:
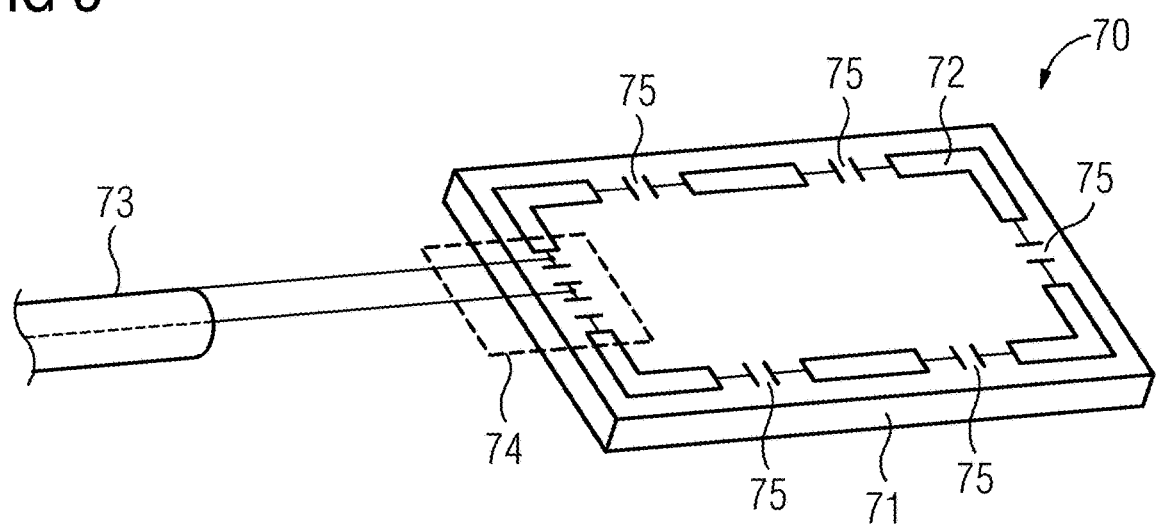
FIG. 5 depicts a schematic representation of a form of the sensor according to an embodiment.

The embodiment depicted in FIG. 5 is a resonant form of the conductor loop from FIG. 4. Since for the Lamor frequencies used in magnetic resonance tomography systems 1 in the case of magnets for example up to 3 T the wavelength in free space is greater than 2 m, the conductor loop is in most cases small compared to the wavelength. A resonance of the conductor loop in a frequency range in the order of the Lamor frequency may be achieved for example by so-called extension capacitors 75, that at one or more locations along the circumference of the conductor loop bridge a break in the conductor loop. The resonance may for example also be achieved by a capacitor in the electronic circuit 74 that closes the conductor loop, so that a parallel resonant circuit is formed. Here too the electronic circuit may have further functions as described above.

Figure 6:
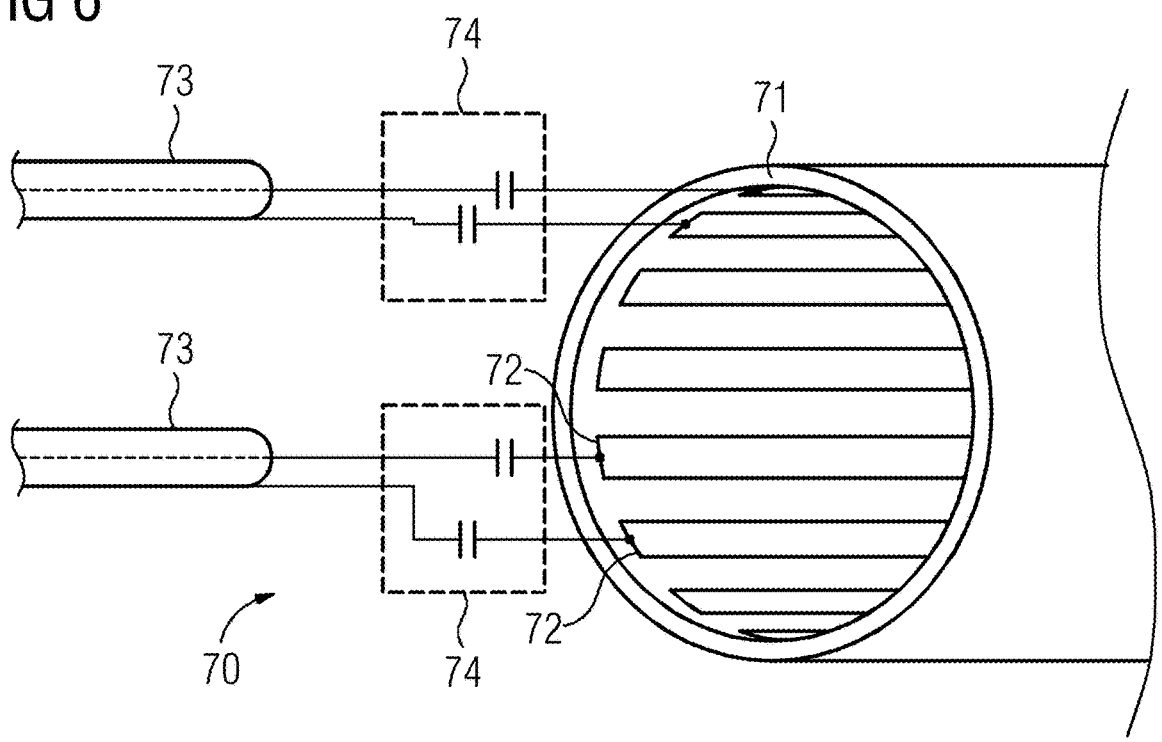
FIG. 6 depicts a schematic representation of the sensor according to an embodiment.

FIG. 6 schematically depicts an embodiment of the sensor 70 in which the conductor surface 72 is part of a radio-frequency shield that is arranged between body coil 14 and gradient coil 12. The radio-frequency shield forms a metal surface that is slotted to prevent eddy currents through the gradients, i.e., is divided into electrically separate regions. The separate regions may for example be parallel strips that extend in the longitudinal direction along the patient tunnel. The radio-frequency shield may also be arranged directly on a non-conductive surface, facing the body coil 14, of the gradient coil 12. However, a separate support, for example an insulating layer 71, may be arranged between body coil 14 and gradient coil 12.

In embodiment in FIG. 6, the electrically separate regions of the radio-frequency shield are used as a conductor surface 72 of the sensor. In embodiment represented, two different electrically separate regions are in this case electrically connected to both poles of the signal connection. However, just one pole of the signal connection, for example the core of the coaxial cable 74, may be connected to a region of the radio-frequency shield, while the other pole of the signal connection is connected to a ground of the magnetic resonance tomography system, for example a ground of the gradient coil 12.

As shown in FIG. 6, multiple strips of the radio-frequency shield may be connected to separate signal connections and via the multiple strips may be used to separate receivers 60, in order to form separate sensors 70. In this way spikes from different regions of the gradient coil 12 may be better detected. In this way it is also possible for a place of origin of the spike to be located thanks to different amplitudes or phases of the signal in different sensors 70 or to be restricted to one region of the gradient coil 12.

Figure 7:
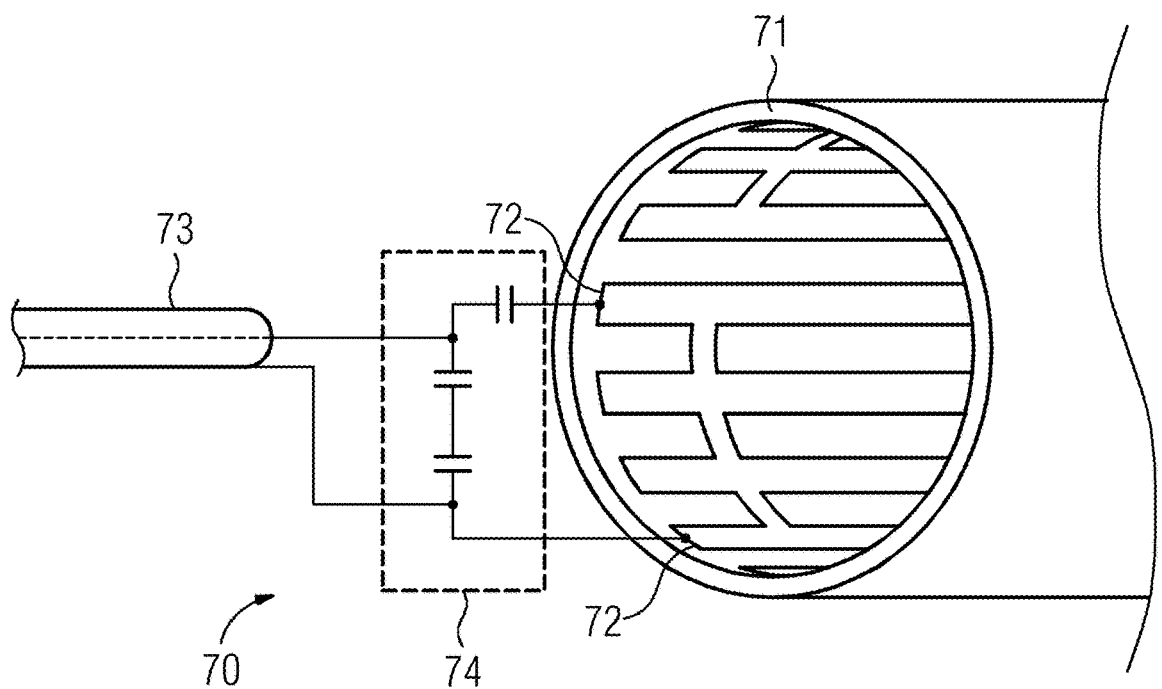
FIG. 7 depicts a schematic representation of the sensor according to an embodiment.

FIG. 7 depicts an embodiment of a sensor 70 as part of a radio-frequency shield, that differs from FIG. 6 in that the conductor surface 72 is formed as a conductor loop, the electrically separate regions or strips having at least one location an electrical connection in addition to the electronic circuit 74 or the signal connection. For example, the strips or regions may be connected by a conductor strip or ring that electrically connects the strips transversely to their extension. A connection by an electrical component such as a capacitor, for example may be used. Thanks to this or in connection with the electronic circuit a resonance frequency of the conductor loop may also be set. For example, the resonance frequency may also be set such that the function as a radio-frequency shield is not disruptively impaired.

It is also possible, as already shown in FIG. 6, to form multiple independent conductor loops, in order to provide multiple sensors 70, for example by configuring the electrically connecting ring only as one or more segments that connect only a few adjacent strips or regions to one another, so that multiple conductor loops electrically independent of one another may be formed. It is also conceivable to decouple adjacent conductor loops despite shared conductor segments, by suitably selecting the position and length of the shared conductor segments.

Figure 8:
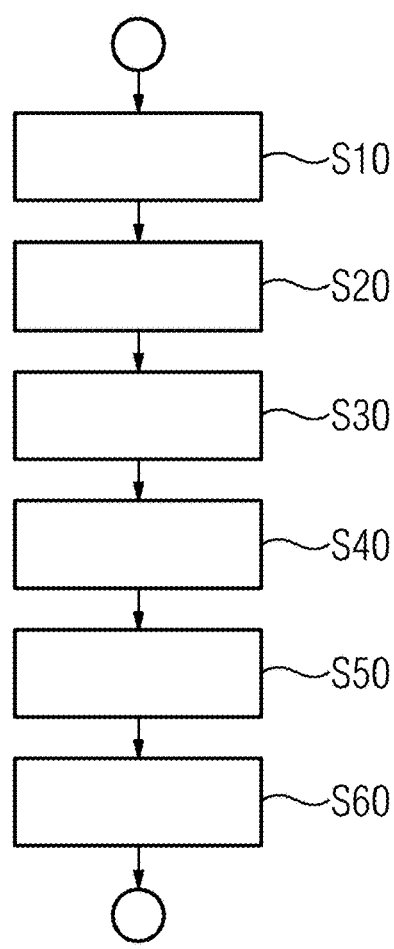
FIG. 8 depicts a schematic flow chart of a method according to an embodiment.

FIG. 8 depicts a schematic flow chart of an embodiment of the method.

In a step S10 nuclear spins of an object under observation are excited by a magnetic alternating field of the magnetic resonance tomography system 1. An oscillator of the radio-frequency unit generates a signal at a Lamor frequency of the nuclear spin in the magnetic field B0 of the magnetic resonance tomography system 1, a power end stage amplifies the signal and the body coil 14 irradiates it into the object under observation or the patient.

Depending on the sequence, simultaneously and/or subsequently in a step S20 a gradient field for position encoding or influencing of the nuclear spins using the gradient coil 12 is generated by the magnetic resonance tomography system 1. The resultant fields and mechanical stresses may mean that static discharges, known as spikes, occur immediately or with a delay.

In a further step S30 a magnetic resonance signal from the object under examination or patient 100 is acquired by the controller 23 of the magnetic resonance tomography system 1 by a receiver 60 via the body coil 14 or the local coil 50.

In another step S40 an interference signal, for example a spike, is detected, using the sensor 70, by the controller 23 of the magnetic resonance tomography system 1 by a receiver 60. The receiver 60 may be a receiver 60 of the radio-frequency unit 20 that is also configured to acquire magnetic resonance signals. However, a dedicated interference signal receiver may be provided in the magnetic resonance tomography system 1, and to be configured for example for a different frequency range.

The amplitude of the interference signal may be evaluated in the step and for example for an overmodulation may be identified thanks to a strong spike and may be used to adjust an amplification in the receiver 60 such that the interference signal remains in the linear range.

In a step S50 an image is reconstructed by the controller 23 or by a dedicated image reconstruction computer from the magnetic resonance signal as a function of the acquired interference signal of the sensor 70.

For example, after suitable attenuation and phase displacement the signal of the sensor 70 may be added to the magnetic resonance signal, in order by destructive interference to reduce a portion of the interference signal. In this case attenuation and phase displacement may for example be set by the controller 23 using an optimization method, in which the energy of the sum signal is minimized. The interference signal may be detected simultaneously with the magnetic resonance signal, in order to execute the interference suppression in real time or later by the stored magnetic resonance signal and interference signal.

However, an identified spike in the interference signal may cause the controller 23 to repeat the disrupted detection of the magnetic resonance signal and thus to detect a signal free from interference by spikes.

The spike may be corrected by interpolation or insertion of a constant value.

In an embodiment of the method the receiver may carry out a spectral weighting of the interference signal. For example, the frequency range around the Lamor frequency may be attenuated or suppressed, to make it easier to identify a spike. It is possible, simultaneously or alternatively for interference suppression using interference, for the received interference signal to be restricted to the frequency range of the magnetic resonance signal.

The method may be used in an embodiment to identify a source of spikes. In step S40 the interference signal of the spike is detected with a plurality of sensors 70 that are distributed such that as corner points of a polyhedron they span a three-dimensional space. The interference signal of the spike is forwarded via the plurality of sensors 60 to a plurality of receivers, that then evaluate it in respect of amplitude and/or phase. This may involve receivers of the magnetic resonance tomography system in the radio-frequency unit 22 that are also used to receive the magnetic resonance signal. This may advantageously provide dedicated receivers for the sensors to be dispensed with if the monitoring is to take place on spikes only between the receipt phases for the magnetic resonance signal.

This may be the case if in this way there is no need for a magnetic resonance signal for an image to be detected by a separate diagnostic step during maintenance or installation. It is then also possible to omit the steps S10 excitation of the nuclear spins, S30 acquisition of a magnetic resonance signal, and S50 reconstruction of an image from the magnetic resonance signal.

In a step S60 the interference signals are evaluated by the spike that is detected by the plurality of sensors 60 and receivers, in order to locate a source of the spike, i.e., to restrict its location more closely. For example, the location of the source may be restricted using the travel time differences and the resultant different delay in the interference signals arriving. For example, with four sensors the source may theoretically be fixed in three-dimensional space. Alternatively, or additionally the different amplitude may be used for localization, by using the quadratic distance rule to estimate a relative distance of the source from a sensor. By combining amplitude and travel time the localization may for example be improved in an error minimization method. Not least, assumptions about the source, for example that the spikes arise in a support body or insulating material of the gradient coil 12, may improve the localization or enable it using a smaller number of sensors.

Individual sensors may be positioned at empirically known places of origin of most of the spikes, for example the supply lines of the gradient coil.

Figure 9:
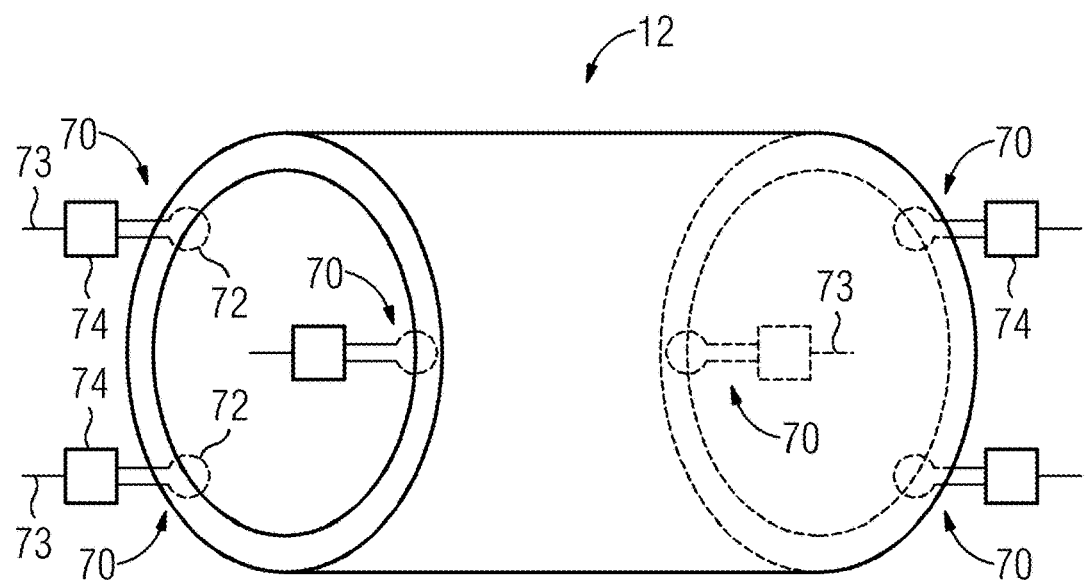
FIG. 9 depicts a schematic representation of the sensor according to an embodiment.

FIG. 9 depicts an embodiment of a magnetic resonance tomography system 1 including a spatial distribution of sensors 70. For the sake of clarity only the gradient coil 12 or the support bodies thereof are represented. By way of example, the gradient coil 12 includes a support body made of a molded resin, into which the windings of the magnetic coil or magnetic coils are embedded. Distributed around the circumference of the respective openings in the support body, in each case three conductor loops as conductor surfaces 72 are embedded into the molded resin of the support body, for example in each case at least one conductor surface 72 is located in the vicinity of a connection line of the magnetic coil. Thanks to the distribution along the circumference, a space is advantageously spanned, in order to be able to determine the places of origin of the spikes as already described.

Arranged in the immediate vicinity of the conductor loop is an electronic circuit 74, that as already described undertakes a first processing of the interference signal and/or protects the sensor during the excitation pulse. By arranging the electronic circuit 74 outside of the support body, it may easily be replaced in the event of a defect.

Although the invention has been illustrated and described in greater detail using an exemplary embodiment, the invention is not restricted by the disclosed examples and other variations may be derived therefrom by the person skilled in the art, without departing from the scope of protection of the invention.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that the dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance tomography system comprising:
   a sensor for detecting a spike; and
   a gradient coil, wherein the sensor is arranged in an immediate vicinity of the gradient coil, wherein the sensor is arranged on an insulating layer, the insulating layer configured to provide a mechanical connection to the gradient coil, a body coil, or shielding.

2. The magnetic resonance tomography system of claim 1, wherein the sensor is configured to acquire an interference signal at a frequency not equal to a Lamor frequency of the magnetic resonance tomography system.

3. The magnetic resonance tomography system of claim 1, wherein the sensor includes a conductor surface for detecting the spike, wherein the conductor surface is part of a radio-frequency shield of the gradient coil.

4. The magnetic resonance tomography system of claim 1, wherein the sensor includes a frequency-selective preamplifier.

5. The magnetic resonance tomography system of claim 1, wherein the sensor is in signal connection with a receiver of the magnetic resonance tomography system.

6. The magnetic resonance tomography system of claim 1, wherein the sensor includes an electrical field antenna or a B-field antenna.

7. The magnetic resonance tomography system of claim 5, wherein an antenna of the sensor is resonant.

8. The magnetic resonance tomography system of claim 7, wherein the antenna of the sensor includes a detuning device.

9. The magnetic resonance tomography system of claim 1, wherein the magnetic resonance tomography system comprises a plurality of sensors that are distributed over an extension of the gradient coil.

10. A method for operating a magnetic resonance tomography system, the method comprising:
    generating a gradient field using a gradient coil by the magnetic resonance tomography system; and
    acquiring an interference signal using a sensor configured for detecting spikes
    wherein the sensor is embedded in a support material of the gradient coil.

11. The method of claim 10, wherein the method further comprises:
    exciting of nuclear spins of an object under observation by a magnetic alternating field of the magnetic resonance tomography system;
    acquiring a magnetic resonance signal using a receiving antenna of the magnetic resonance tomography system; and
    reconstructing an image from the magnetic resonance signal as a function of the interference signal of the sensor;
    wherein an effect of the interference signal on the image is reduced.

12. The method of claim 10, wherein acquisition of an interference signal comprises acquiring the interference signal using a plurality of interference sensors distributed over an extent of the gradient coil and wherein the method further comprises:
    determining a place of origin of the interference signal as a function of a position of the plurality of interference sensors and the plurality of the acquired interference signals.

13. The method of claim 10, wherein the interference signal of the sensor is detected by a receiver of the magnetic resonance tomography system for magnetic resonance signals.

14. The method of claim 13, wherein the receiver carries out a spectral weighting of the interference signal.

15. A magnetic resonance tomography system comprising:
    a sensor for detecting a spike; and
    a gradient coil, wherein the sensor is arranged in an immediate vicinity of the gradient coil;
    wherein the sensor includes a conductor surface for detecting the spike, wherein the conductor surface is part of a radio-frequency shield of the gradient coil.

* * * * *